(12) United States Patent
Wang

(10) Patent No.: US 6,297,681 B1
(45) Date of Patent: Oct. 2, 2001

(54) MULTI-CELL DELAY GENERATOR DEVICE WHEREIN THE CELLS HAVE TRANSISTOR STACKS AND SELECTIVE STACK TRANSISTOR BYPASSES

(75) Inventor: Zhenhua Wang, Zürich (CH)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/439,202

(22) Filed: Nov. 12, 1999

(30) Foreign Application Priority Data

Nov. 13, 1998 (EP) .................................................. 98203834

(51) Int. Cl.[7] .................................................. H03H 11/26
(52) U.S. Cl. ........................ 327/281; 377/48; 377/117; 377/122
(58) Field of Search ....................... 327/117, 118, 327/276, 277, 278, 279, 281; 326/95, 98, 121, 119; 377/47, 48, 108, 117, 122

(56) References Cited

U.S. PATENT DOCUMENTS

| 4,953,187 | * | 8/1990 | Herold et al. | ............................ 327/48 |
| 6,100,730 | * | 8/2000 | Davis et al. | ............................ 327/117 |

FOREIGN PATENT DOCUMENTS

WO9008428    7/1990    (WO) ............................ H03K/23/48

OTHER PUBLICATIONS

Japanese Abstract 55-133135(A) Date Oct. 16, 1980; Appl. No. 54-401149.

* cited by examiner

Primary Examiner—Terry D. Cunningham
Assistant Examiner—Quan Tra
(74) Attorney, Agent, or Firm—Jack D. Slobod

(57) ABSTRACT

A digital delay generator device is based on a series arrangement of cells, wherein each cell has a first input for receiving a single-phase clock signal, a second input for receiving a delayable signal for thereto imparting a cell delay, and an output for a so-delayed signal. Each cell comprising a series stack of transistors, and various cells comprise further transistor means for receiving a bypass control signal. Such further transistor means are arranged for under control of a bypass control signal effectively bypassing one or more cells to thereby effect a quantized overall delay shortening. In particular, such various cells form a contiguous pair in said string, and the transistor means effectively form respective transistor bypasses over clock-signal-controlled transistors in the associated series stack at mutually opposite sides of their respective stack.

7 Claims, 5 Drawing Sheets

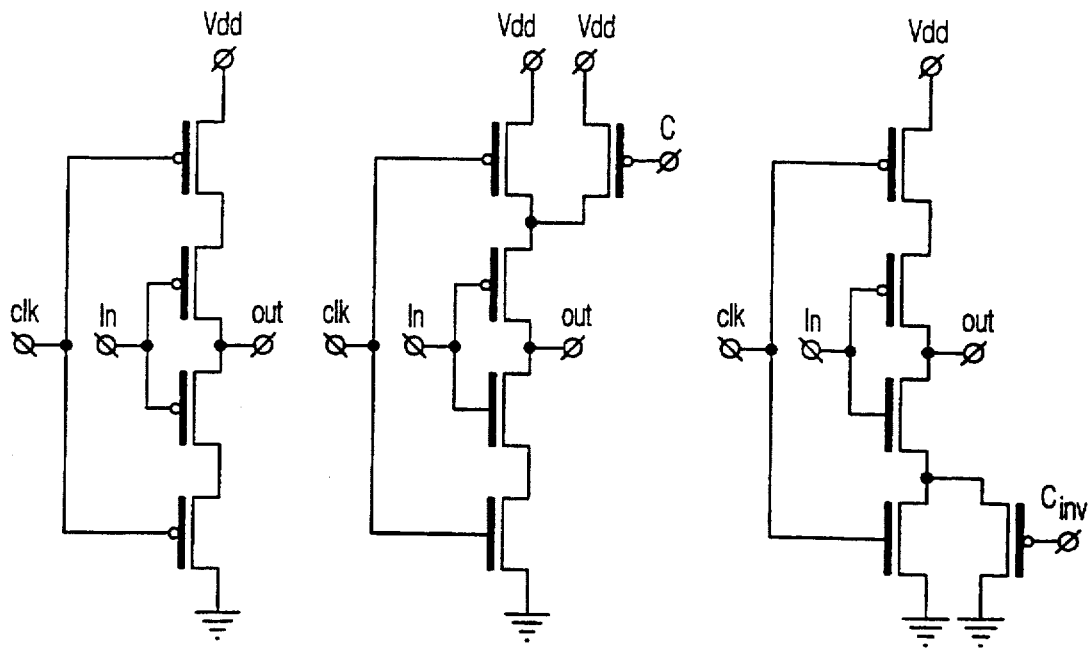

simulated division ratios of both divide-by-4/5 prescalers
| Input clock frequency (MHz) | Prescaler Integrated In OM4048 | | Prescaler described in this communication | |
|---|---|---|---|---|
| | MC=1 | MC=0 | MC=1 | MC=0 |
| 250 | 5 | 4 | 5 | 4 |
| 300 | 6 | 5 | 5 | 4 |
| 450 | 9 | 6 | 5 | 4 |
FIG. 5
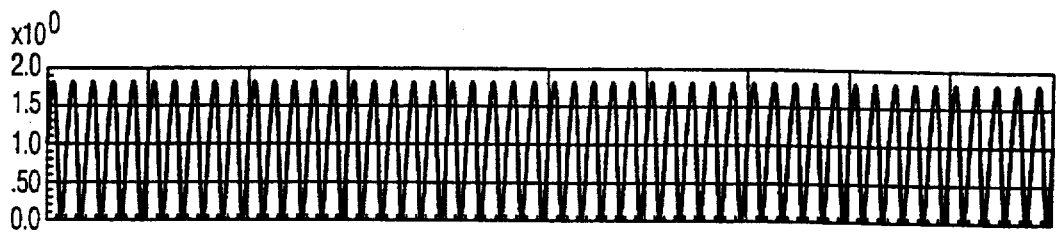
FIG. 6A
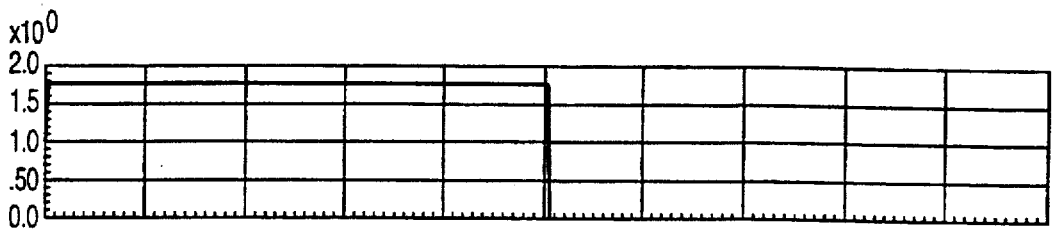
FIG. 6B
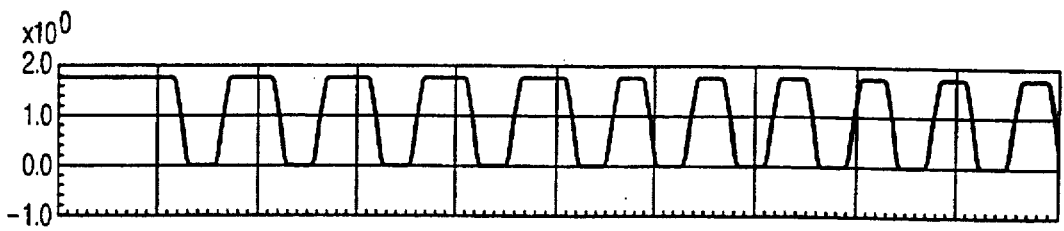
FIG. 6C
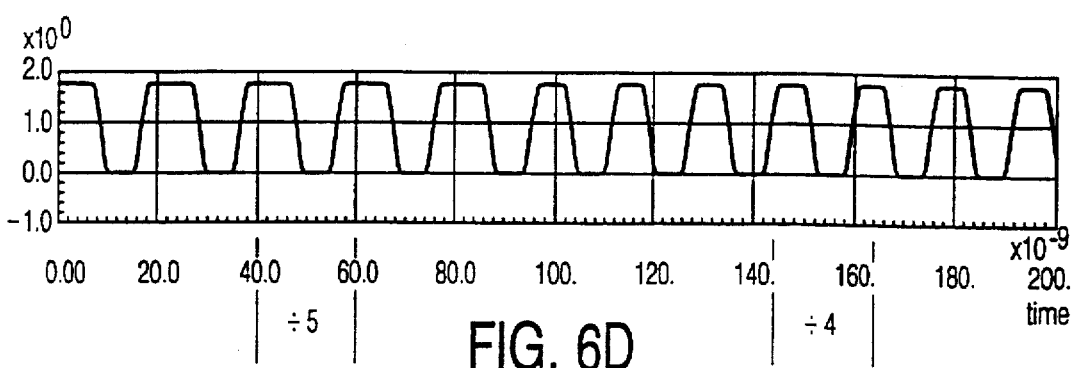
FIG. 6D

US 6,297,681 B1

MULTI-CELL DELAY GENERATOR DEVICE WHEREIN THE CELLS HAVE TRANSISTOR STACKS AND SELECTIVE STACK TRANSISTOR BYPASSES

BACKGROUND OF THE INVENTION

The invention relates to a digital delay generator device as recited in the preamble of claim 1. Such devices may constitute a loop, thereby forming a ring counter, or rather a device without retrocoupling: The latter configuration will impart a straightforward delay. Dual-modulus or multi-modulus devices of this form, and in particular in the retrocoupled version, constitute an important and integral part of frequency synthesizers that are based on phase-locked loops. Ultimately, the properties of the circuit will determine the highest frequency that the overall device can attain. An earlier version of the device in effect did immediately follow an RF amplifier, and had added various extra transistors to the controllable stages, both in series with the other transistors of the stack in question, and also in parallel therewith. In effect, these added facilities proved to limit the attainable clock frequency to a low value. Next to minimizing the stack height, the minimizing of the number of nodes would be a further goal of the designer.

SUMMARY TO THE INVENTION

In consequence, amongst other things, it is an object of the present invention to propose a device as recited in the preamble, wherein a lesser stack height, as well as a lower number of nodes would allow to operate the circuit at a raised input clock frequency. Now therefore, according to one of its aspects the invention is characterized according to the characterizing part of claim 1.

By itself, JP Patent Application Laid Open A 55/133 135 discloses a frequency dividing circuit, wherein a single cell has an extra transistor bridging one of the stack transistors. However, this facility does not provide a digital amending of the overall division factor, but rather an analog amending of the delay of just one cell. In consequence, the electronic functionality of the earlier circuit is radically different from that of the present circuit.

The present invention also relates to a comprehensive electronic circuit and to a portable telecommunications apparatus provided with a device according to the invention. At the present state of technology, there is a great need for raising of the operational frequency of such devices at a low level of power consumption. Further advantageous aspects of the invention are recited in dependent claims.

BRIEF DESCRIPTION OF THE DRAWING

These and further aspects and advantages of the invention will be discussed more in detail hereinafter with reference to the disclosure of preferred embodiments, and in particular with reference to the appended Figures that show:

FIGS. 4A–4F, three cells used in a new version of the device, and their truth tables;

FIG. 5, a summary of simulated results of two prescaler versions;

FIGS. 6A–6D give the simulation results of the two versions at 250 MHz;

DETAILED DESCRIPTION OF PREFERRED EMBODIMENTS

Figure 1:
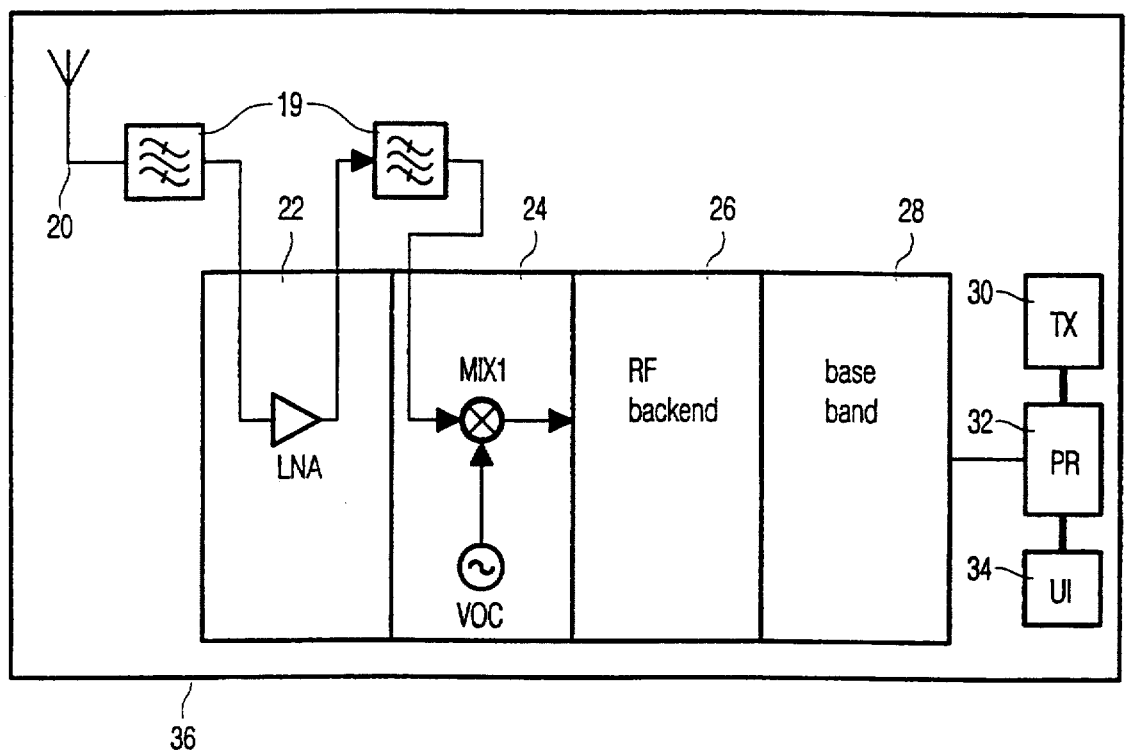
FIG. 1, a one-chip transceiver concept with mixer & VCO in its front-end section.

FIG. 1 represents a one-chip transceiver concept with mixer and VCO in its RF-front-end section 24. Such realization will be useful in an environment for low-cost, wireless, and battery-powered transceivers, such as could be useful in portable communication devices such as cellular and cordless telephones, pages, and other. The schematic of FIG. 1 has an RF front end 22+24, an RF back end 26 and baseband 28 subsystems. The signals picked up by an antenna 20 are amplified by an LNA circuit 22 with the help of band-pass filters as shown, and then down-converted with one or more mixers. The function of the mixer is to lower the frequency, sometimes to dc. A conventional mixer topology is the Gilbert cell that has one input port for the RF signal from the LNA, and the other for a VCO or local oscillator that can have a controllable frequency divider as will be discussed hereinafter, and which frequency has been tuned exactly to the desired value. Depending on the chosen architecture, the LO frequency may be higher than, lower than, or equal to the RF input frequency. Generally, the current consumption by both the VCO and the mixer is in the milliamps range, as being dictated by the required noise figures of the respective items.

The inventive circuit to be discussed hereinafter forms part of a comprehensive circuit module 22 that effects nearly all of the necessary receiver functionality of the portable communications device 36 and which may be realized as a single integrated circuit package. The telecommunications device will generally take up the output signal from baseband stage 28 in processing stage 32 for further conversion, such as to speech and control signals. Item 34 is a human interface module that comprises keyboard, display, speech I/O and possibly further functionality. Item 30 is a transmitter functionality module that receives signals from processing module 32 for therefrom constructing a feasible transmission signal. Generally, this will need reusing various further elements of the device, such as power supply and antenna. For brevity, these further aspects have not been recited in detail.

Figure 2:
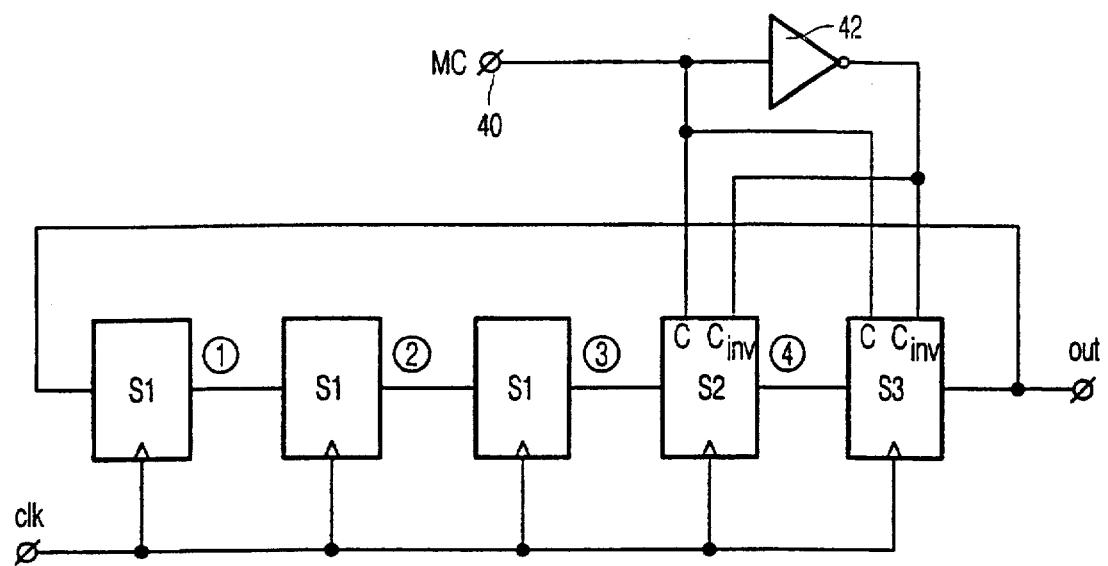
FIG. 2, a block diagram of a ⅘ prescaler.

FIG. 2 is a block diagram of a ⅘ prescaler that contains triple stages S1 and single stages S2, S3. The output of the last stage S3 represents the overall output of the device, and furthermore is retrocoupled to the input of the first stage S1. Without retrocoupling, the function is the imparting of a straight delay. All cells are clocked by single-phase external clock clk. Furthermore, control input 40 receives a control signal MC. The control signal is connected in uninverted form to control inputs C of cells S2, S3, and furthermore, in inverted form to control inputs Cinv of cells S2, S3. A first value of control signal MC will activate all cells in their normal way, thereby constituting a divider by 5. A second value of control signal MC will activate cells S2, S3 in a modified way, so that they effectively present a one-stage delay only. Thereby a divider by 4 is constituted. The control signal MC from control input 40 is used in an univerted manner, as well in an inverted manner through inverter 42. By itself, the number of cells is arbitrary. Furthermore, the adding of further control features over the ones shown can be operative for further amending the division factor.

Figures 3A, 3B, 3C:
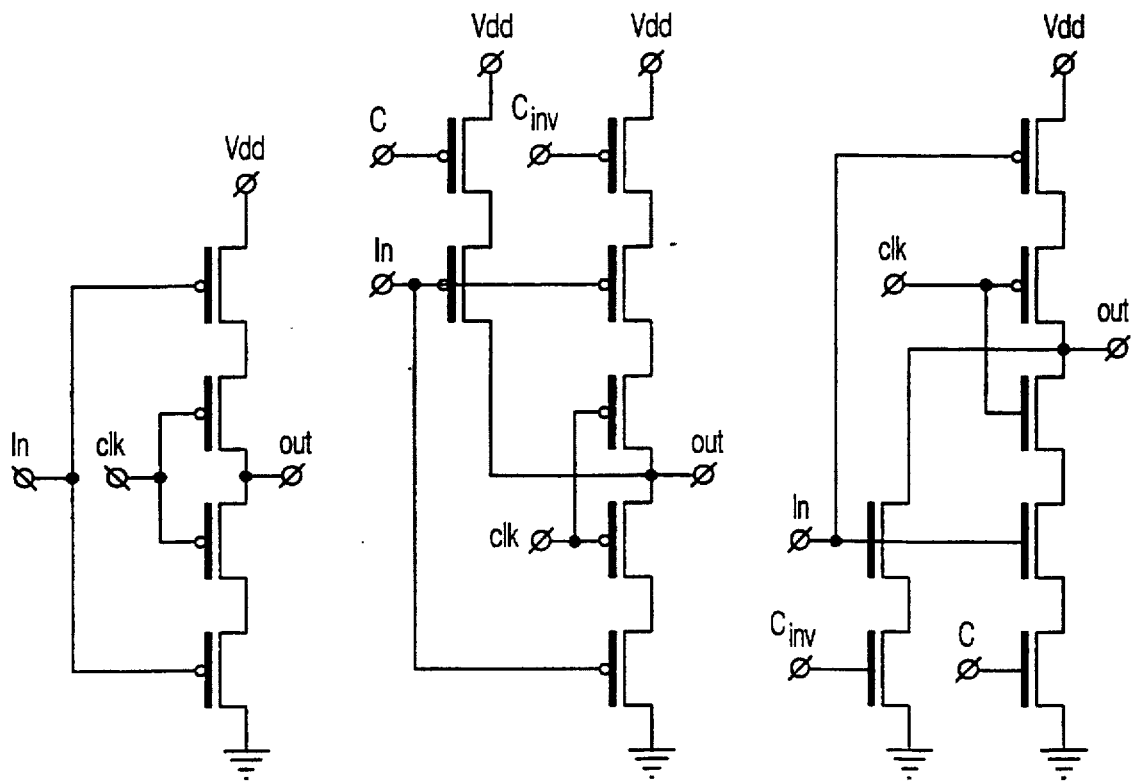
FIGS. 3A–3C, three cells used in an earlier version of the device.
Figure 7A:
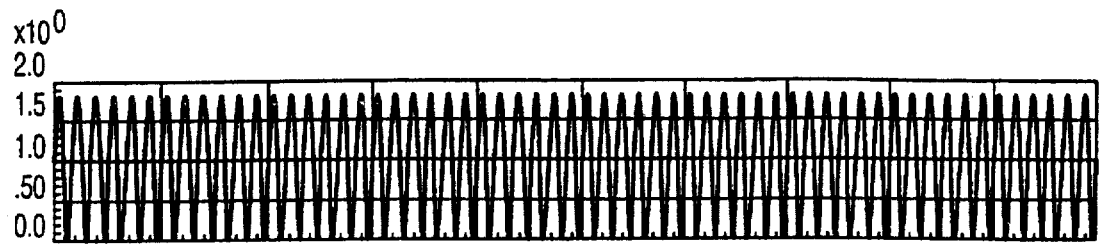
FIGS. 7A–7D give the simulation results of the two versions at 300 MHz.
Figure 7B:
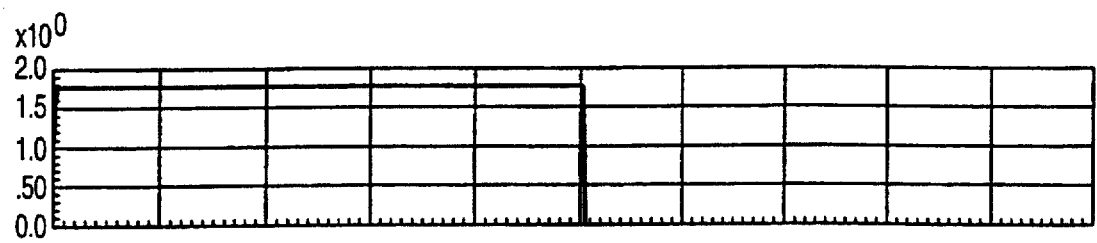
Figure 7C:
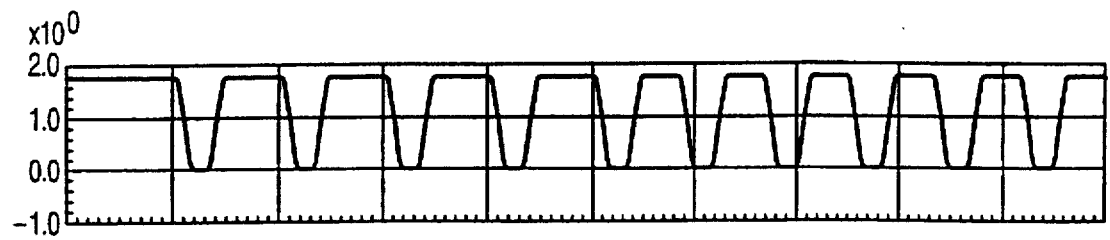
Figure 7D:
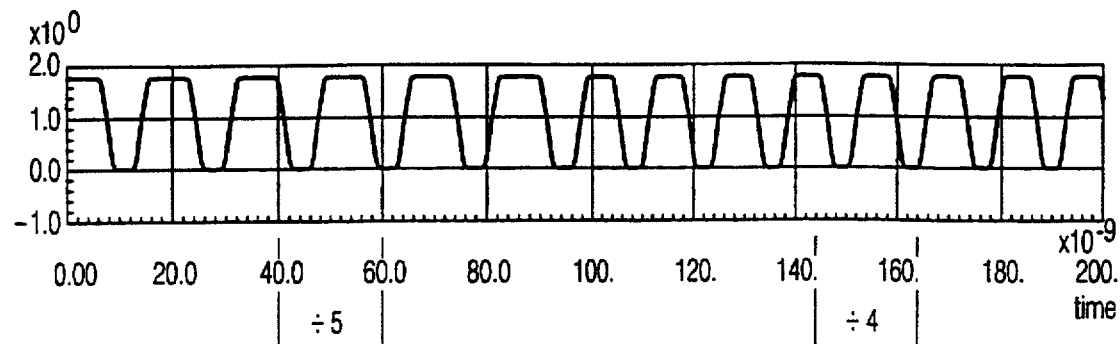

FIGS. 3A–3C show three cells used in an earlier version of the device. FIG. 3A represents the standard circuit S1 that is controlled by the clock signal on the innermost transistors of a four-transistor stack. The output signal from the preceding cell is coupled to the two outer transistors of the stack. The junction of the two clocked transistors forms the output of the cell. FIG. 2B represents cell S2. Next to the circuitry associated to the cell S1, a further transistor has been added at the high-voltage side in series with the original stack of transistors, for receiving control signal Cinv. Moreover, a second further transistor has been added in series with the lower part of the stack for receiving the control signal C. This second further transistor is in series with a third further transistor that is immediately controlled by the delayable input signal In. This raises the total number of transistors to seven.

FIG. 3C represents the cell S3. Here, the control signal C is coupled to a further transistor that is arranged in series with the four-transistor stack. Control signal Cinv is inputted to a second further transistor that is arranged in series with the upper part of the four-transistor stack. A third further transistor has been added in mirrored manner with respect to FIG. 3B. Since there are as many as seven transistors and as many as nine nodes in the arrangements of both FIGS. 3B and 3C, the attainable frequency is lowered through parasitic capacitances. Only 250 MHz has been attained in a particular technology.

FIGS. 4A–4C show three cells used in a new version of the device according to the invention. Herein, the maximum numbers of both MOS transistors and nodes have been kept to much lower values than those of FIGS. 3B, 3C. First, FIG. 4A generally corresponds to FIG. 3A, but the clock input is now coupled to the outer transistors, and the signal to be delayed to the inner transistors. The circuits of FIGS. 4B, 4C have functions corresponding to those of FIGS. 3B, 3C, respectively. First, the clocking again is to the outer transistor pairs. Furthermore, a simplification has been attained by restricting the control signal input to each of those two circuits to only a single control signal value, whilst omitting inputting of its complementary value. In this manner, an appropriate control signal value will render a bypassing transistor permanently conductive, and thereby inconsequential the clock signal to the transistor so bypassed. In this manner, a quantized delay shortening is effected. Furthermore, the stack heights reduce to only four transistors, while the maximum number of transistors per cell reduces to five, and the maximum number of nodes per cell reduces to only six. Both measures are operative to raise the attainable speed.

FIGS. 4D–4F, show the truth tables of three improved cells. The S2 and S3 cells now will behave exactly like cell S1 when the control signal C=1.

FIG. 5 presents a summary of simulated results of the two prescaler versions shown in FIGS. 3 and 4, respectively. It is immediately clear that the earlier version will give correct results up to only 250 MHz. The newer version will give correct results up to 450 MHz. It should be noted that also a minimum input frequency is required for such circuits, but this threshold value is inconsequential for all practical purposes.

FIGS. 6A–6D give simulation results of the two versions at 250 MHz, and FIGS. 7A–7D the simulation results of the two versions at 300 MHz. For each of the simulated frequencies, the top diagram represents the single-phase clock signal. Furthermore, the second diagram gives the control signal that changes from high to low in the middle of the Figure. The third diagram represents the output from the conventional circuit. The fourth diagram represents the output from the improved circuit. It is evident that both versions present identical results in FIG. 6, whereas the difference is immediately evident in FIG. 7. Also at 450 MHz, the new version operates according to specifications.

What is claimed is:

1. A digital delay generator device based on a series arrangement of cells, wherein each cell has a first input for receiving a single-phase clock signal, a second input for receiving a delayable signal for thereto imparting a cell delay, and an output for a so-delayed signal, each cell comprising a series of stack transistors, and wherein furthermore various cells comprise further transistor means for receiving a bypass control signal, said further transistor means being arranged for under control of a bypass control signal effectively bypassing one or more cells to thereby effect a quantized overall delay shortening, characterized in that such various cells form a contiguous pair in said string, wherein each cell of a said pair comprises only five transistors and only six nodes, and the transistor means effectively form respective transistor bypasses over clock-signal-controlled transistor in the associated series stack at mutually opposite sides of the respective stack.

2. A device as claimed in claim 1, wherein said series arrangement forms a loop for so constituting a ring counter.

3. A device as claimed in claim 1, wherein the transistor bypasses of a said pair are controlled by mutually inverse values of the associated control signal.

4. A device as claimed in claim 1, wherein the transistor bypasses of a said pair are each formed by only a single transistor of identical conductivity type as their respectively bypassed transistor.

5. A device as claimed in claim 1 and executed in complementary MOS.

6. A comprehensive RF receiver circuit module comprising an RF front end module based on a device as claimed in claim 1, that furthermore feeds a sequence which comprises an RF backend module and a baseband module.

7. A portable telecommunications device comprising a receiver circuit module as claimed in claim 6 and being interconnected to signal processing means, and furthermore comprising interconnected therewith human interface means and signal transmitter means.

* * * * *